(12) United States Patent
Sun et al.

(10) Patent No.: US 6,806,440 B2
(45) Date of Patent: *Oct. 19, 2004

(54) QUASI-CW DIODE PUMPED, SOLID-STATE UV LASER SYSTEM AND METHOD EMPLOYING SAME

(75) Inventors: Yunlong Sun, Beaverton, OH (US); Richard S. Harris, Portland, OR (US)

(73) Assignee: Electro Scientific Industries, Inc., Portland, OR (US)

(*) Notice: Subject to any disclaimer, the term of this patent is extended or adjusted under 35 U.S.C. 154(b) by 204 days.

This patent is subject to a terminal disclaimer.

(21) Appl. No.: 10/096,629

(22) Filed: Mar. 12, 2002

(65) Prior Publication Data

US 2002/0125227 A1 Sep. 12, 2002

Related U.S. Application Data

(60) Provisional application No. 60/275,246, filed on Mar. 12, 2001.

(51) Int. Cl.[7] .............................................. B23K 26/38
(52) U.S. Cl. .............................. 219/121.71; 219/121.61
(58) Field of Search ....................... 219/121.7, 121.71, 219/121.6, 121.61; 372/22, 13

(56) References Cited

U.S. PATENT DOCUMENTS

| | | | |
|---|---|---|---|
| 3,806,829 A | 4/1974 | Duston et al. ............. 331/94.5 |
| 3,962,558 A | 6/1976 | Kocher et al. ............. 219/121 |
| 4,276,497 A | 6/1981 | Burbeck et al. ............ 315/209 |
| 4,337,442 A | 6/1982 | Mauck ........................ 372/13 |
| 4,930,901 A | 6/1990 | Johnson et al. ............. 372/26 |
| 5,151,909 A | 9/1992 | Davenport et al. .......... 372/22 |
| 5,291,505 A | 3/1994 | Nielsen ....................... 372/38 |
| 5,293,025 A | 3/1994 | Wang .................... 219/121.71 |
| 5,361,275 A | * 11/1994 | Opower |
| 5,593,606 A | 1/1997 | Owen et al. ............ 219/121.71 |
| 5,751,585 A | 5/1998 | Cutler et al. ............ 364/474.03 |
| 5,822,211 A | 10/1998 | Barenboim et al. |
| 5,841,099 A | 11/1998 | Owen et al. ............ 219/121.69 |
| 5,847,960 A | 12/1998 | Cutler et al. ............ 364/474.29 |
| 5,854,805 A | 12/1998 | Reid et al. .................... 372/70 |
| 5,943,351 A | 8/1999 | Zhou et al. .................. 372/22 |
| 5,998,759 A | 12/1999 | Smart ..................... 219/121.69 |
| 6,188,704 B1 | 2/2001 | Kwon et al. .................. 372/25 |
| 6,246,706 B1 | * 6/2001 | Kafka et al. |
| 6,281,471 B1 | 8/2001 | Smart ..................... 219/121.62 |
| 6,359,254 B1 | * 3/2002 | Brown .................... 219/121.71 |
| 6,521,866 B1 | * 2/2003 | Arai et al. .............. 219/121.73 |
| 2001/0029674 A1 | 10/2001 | Cutler .............................. 33/1 |
| 2001/0045419 A1 | * 11/2001 | Dunsky et al. ......... 219/121.76 |
| 2002/0185474 A1 | * 12/2002 | Dunsky et al. .......... 219/121.7 |
| 2003/0047541 A1 | * 3/2003 | Sun et al. ................ 219/121.7 |
| 2003/0168435 A1 | * 9/2003 | Steur et al. .............. 219/121.7 |
| 2003/0183603 A1 | * 10/2003 | Forsman et al. ......... 219/121.6 |

FOREIGN PATENT DOCUMENTS

GB    1 545 933    5/1979

* cited by examiner

Primary Examiner—Geoffrey S. Evans
(74) Attorney, Agent, or Firm—Stoel Rives LLP

(57) ABSTRACT

A quasi-CW diode- or lamp-pumped, A-O Q-switched solid-state UV laser system (10) synchronizes timing of the quasi-CW pumping with movement of the positioning system (36) to reduce pumping while the positioning system (36) is moving from one target area (31) to the next target area (31) to form multiple vias in a substrate at a high throughput. Thus, the available UV power for via formation is higher even though the average pumping power to the laser medium (16), and thermal loading of the laser pumping diodes (14), remains the same as that currently available through conventional CW pumping with conventionally available laser pumping diodes (14). The quasi-CW pumping current profile can be further modified to realize a preferred UV pulse amplitude profile.

20 Claims, 2 Drawing Sheets

QUASI-CW DIODE PUMPED, SOLID-STATE UV LASER SYSTEM AND METHOD EMPLOYING SAME

RELATED APPLICATIONS

This patent application derives priority from U.S. Provisional Patent Application No. 60/275,246, filed Mar. 12, 2001.

COPYRIGHT NOTICE

©2001 Electro Scientific Industries, Inc. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

TECHNICAL FIELD

This invention relates to diode-pumped, solid-state lasers and, in particular, to quasi-CW diode-pumped UV laser systems and processing methods employing them, such as for forming vias in circuit boards.

BACKGROUND OF THE INVENTION

Different types of lasers systems have been employed to drill vias at point-to-point target areas on electronic devices or work pieces such as printed circuit boards (PCBs). The following discussion is presented herein only by way of example to diode-pumped, solid-state ultraviolet (UV) laser systems and work piece targets and should not be considered limiting to the scope of invention.

When an acousto-optically (A-O) Q-switched, continuous-wave (CW) diode-pumped (DP), solid-state (SS) laser system, such as Electro Scientific Industries, Inc.'s (ESI) Model 5200 which includes a Light Wave Electronics' (LWE) Model 210 laser, is employed to create vias, the pumping diode or diodes remain active continuously. Laser emission is prevented by closing the Q-switch whenever the positioning system is directed to a new target area on the work piece. After the positioning system is aligned to the new target area, the laser system delivers a laser output containing one or more laser pulses by opening the Q-switch at a predetermined repetition rate.

The LWE Model 210 employs two 20 Watt (W) CW-diodes for pumping and generates 3 W of UV output power at 10 kHz repetition rate. The CW pumping current to the diodes is limited by thermal loading of the diodes. If an application warrants greater UV output power, then either more diodes or diodes with higher current/power must be employed, such as two 30 W diode laser bars or four 20 W diode laser bars. About 8 W of UV output power can be expected from such designs. However, if higher pumping power is employed, thermal loading on the solid-state laser medium is increased. Thermally overloading the laser medium can permanently damage it or cause significant degradation of the laser beam quality and limit the power available. This limitation imposes a critical engineering challenge to the laser system design and manufacturing.

Other pumping schemes are, however, available for a laser design, such as pulse pumping and quasi-CW pumping. An electro-optically (E-O) Q-switched pulsed DPSS UV laser, such as early versions of Lambda Physics' UV "Gator" Model, provide higher laser pulse power but at low pulse repetition rates. For each pumping pulse, only one UV laser pulse is generated. The pumping duration time is limited to a few hundred microseconds ($\mu s$) so the laser output pulse repetition rate is typically limited to below 2 kHz. This pumping scheme is not preferred for drilling vias because it adversely affects drilling throughput.

Traditional quasi-CW pumping resembles pulse pumping but exhibits longer pumping duration time at a lower peak pumping power. The pumping scheme can exhibit a pumping repetition rate of about 1–2 kHz, and the pumping duration time can be from a few hundred $\mu s$ to a few milliseconds (ms), based on the repetition rate and the duty cycle of the diodes used. This pumping scheme allows pumping to a higher level than does CW pumping because the diode "rests" (and thermal loading reduces or stops) whenever the pumping is off. Therefore, the laser output power can be higher during the pumping time period compared to that of a comparable CW pumped laser. The laser output is controlled by regulating the current to the diode(s). The pumping repetition rate of this pumping scheme is, however, still a serious drawback. Typical applications for quasi-CW pumping include those that utilize a long laser pulse width and a modest peak power, such as laser bonding and welding.

A laser system that includes a pumping scheme that facilitates both higher power and a faster repetition rate to increase drilling throughput is therefore desirable.

SUMMARY OF THE INVENTION

Conventional UV laser via drilling systems employ a standard frequency conversion scheme to convert the laser's fundamental wavelength in the IR region to the UV. Such systems preferably employ high UV power and a high pulse repetition rate to achieve high throughput via formation, hence A-O, Q-switched DPSS laser systems have heretofore been preferred for drilling vias.

A commercially desirable system would prefer higher UV power for reducing the via drill time, or to make acceptable vias on some "hard to drill" materials, such as copper and FR4. Thus, a high UV output power (5 to 15 W) at a high pulse repetition rate (a few kHz to a few tens kHz) would be preferred.

Also to be commercially useful, via formation on PCBs, for example, demands a laser system to be capable of making 300 to 400 vias per second. Thus, the laser positioning system has to move to 300 to 400 new locations every second. Typically, it takes the laser system less than one ms to drill one via, but in some cases longer than one ms to move to a new location for a next via. Hence, the time for the laser being ON is actually less than the time the laser is being OFF, which makes the use of the laser quite inefficient.

The present invention provides a quasi-CW diode- or lamp-pumped, A-O, Q-switched solid-state UV laser that synchronizes the timing of the quasi-CW pumping to avoid or reduce pumping while the positioning system is moving from one target area to the next target area and to increase the pumping level beyond the CW pumped level while drilling vias. Thus, the available UV power for via formation is higher even though the average pumping power to the laser medium, and thermal loading of the pumping diodes, remains the same as for conventional CW pumping with conventionally available laser diodes. The quasi-CW pumping current profile can be further modified to realize a preferred UV pulse amplitude profile.

Such a quasi-CW diode- or lamp-pumped, A-O Q-switched, solid-state UV laser is new; the synchronization of the quasi-CW pumping with the beam scanning is new; and the usage of such a laser system for via formation is new.

Additional objects and advantages of this invention will be apparent from the following detailed description of preferred embodiments thereof which proceeds with reference to the accompanying drawings.

DETAILED DESCRIPTION OF PREFERRED EMBODIMENTS

Figure 1:
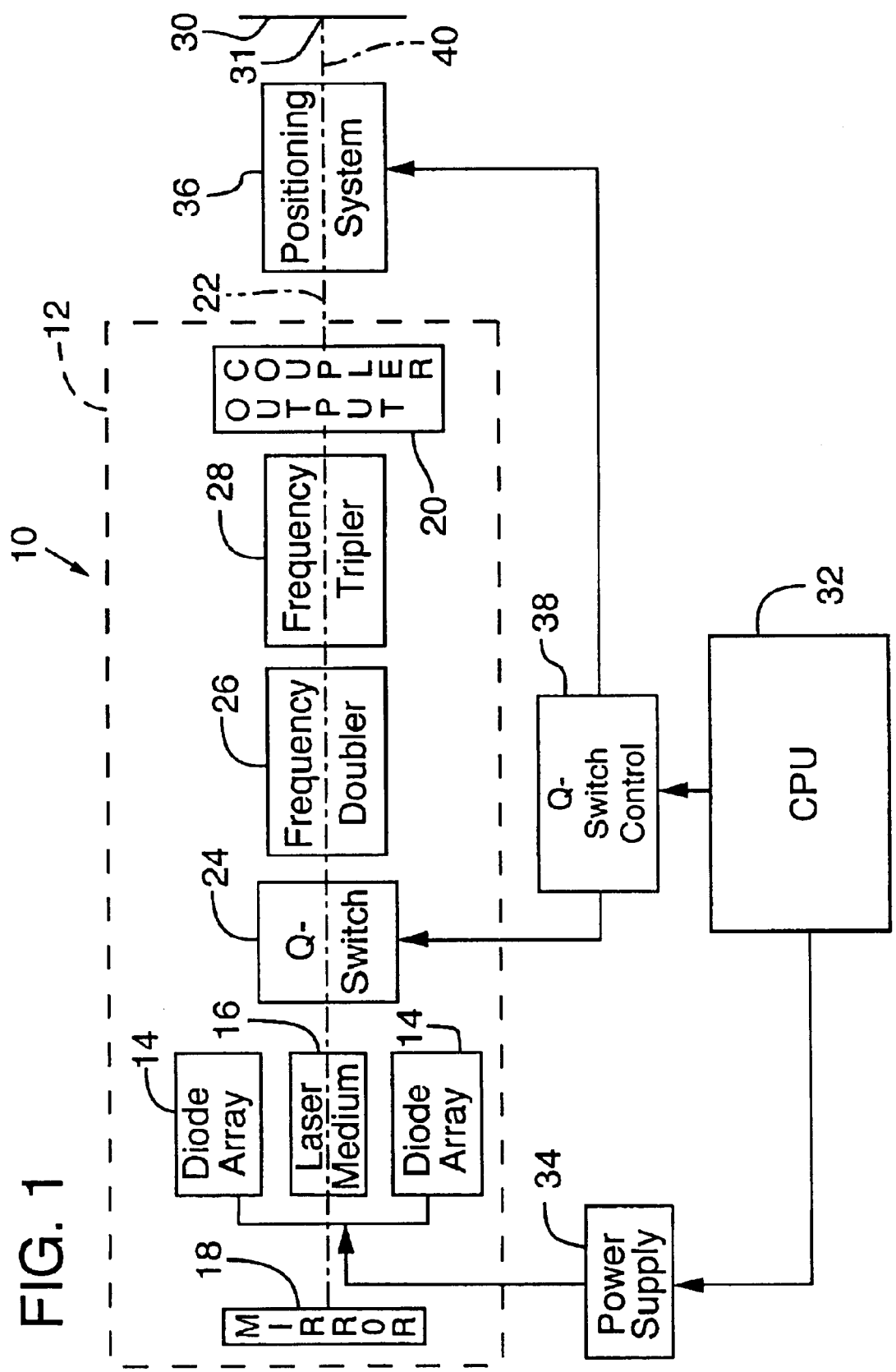
FIG. 1 is a simplified schematic diagram of one embodiment of a quasi-CW diode-pumped, A-O Q-switched laser with intra-cavity tripling frequency conversion.

FIG. 1 is a simplified schematic diagram of a preferred embodiment of a quasi-CW, diode-pumped, A-O Q-switched, solid-state UV laser system 10 with synchronized targeting, pumping, and firing to form vias at a high throughput rate. With reference to FIG. 1, laser resonator 12 of laser system 10 is shown with diodes 14 pumping laser medium 16 from the side. Skilled persons will appreciate, however, that the resonator 12 can fold and that the pumping scheme can be "end pumping" or that laser system 10 could employ other possible well-known configurations. Exemplary diodes 14 include, but are not limited to, Models SDL-3200 series 100 W quasi-CW arrays and 960 W high-duty factor stacked arrays sold by SDL, Inc. of San Jose, Calif. Exemplary solid-state laser mediums (16) include laser mediums having YAG, YLF, and $YVO_4$ compositions. Between an IR-reflective mirror 18 and UV (third harmonic)-transmissive output coupler 20, resonator 12 also includes, along its optic axis 22, an acousto-optic (A-O) Q-switch 24, a frequency doubler 26, and a frequency tripler 28 for intra-cavity frequency conversion. Skilled persons will appreciate that frequency conversion can be accomplished externally to resonator 12.

Figure 2A:
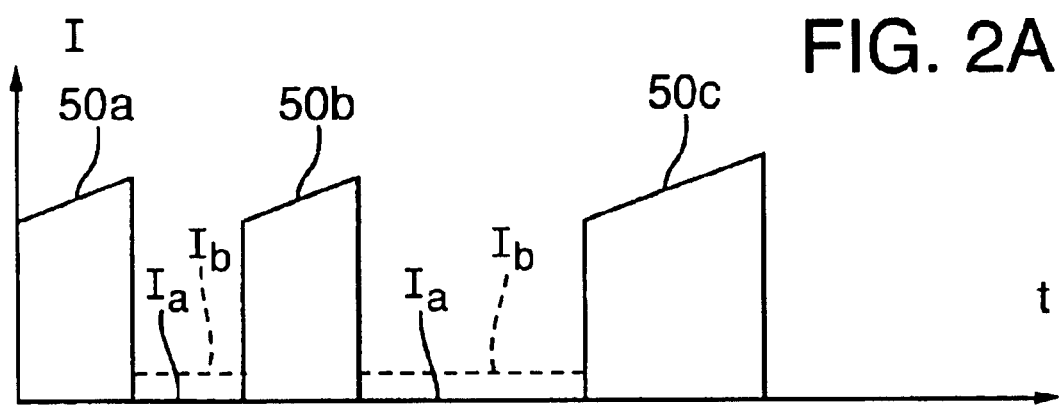
FIG. 2A is a simplified graphical depiction of an exemplary waveform of quasi-CW pumping diode current.
Figure 2B:
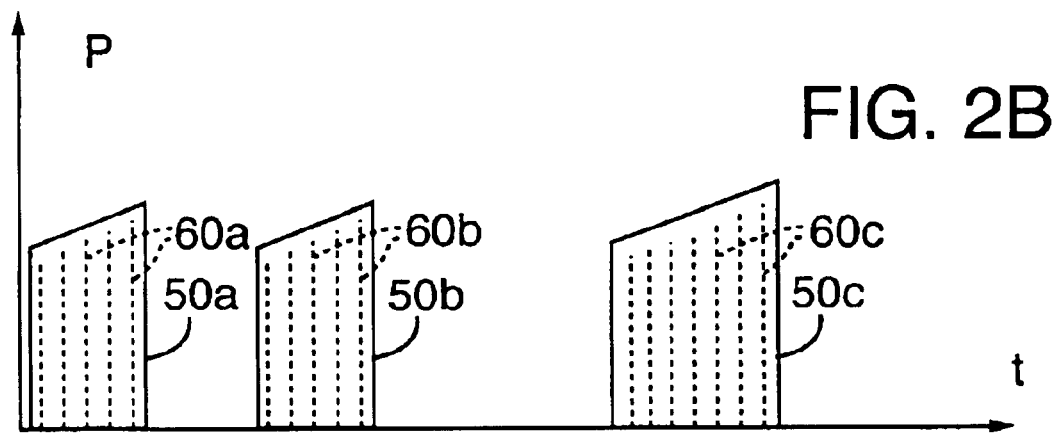
FIG. 2B is a simplified graphical depiction of exemplary A-O Q-switched laser pulses superimposed on the quasi-pumping diode current shown in FIG. 2A.

FIGS. 2A and 2B (collectively FIG. 2) are respective simplified graphical depictions of an exemplary waveform of quasi-CW-pumping diode current pulses or intervals 50a, 50b, and 50c generically current intervals 50) and of exemplary A-O Q-switched laser pulses 60a, 60b, and 60c (generically laser pulses 60) superimposed on the quasi-CW-pumping diode current waveform shown in FIG. 2A. With reference to FIGS. 1 and 2, laser system operation is synchronized such that when the laser system 10 finishes making one via at a first target area 31 on work piece 30, the central processing unit (CPU) 32 stops the diode pumping (turns the diode current level $I^a$ to zero) or reduces the diode pumping to a pre-determined low current level $I^b$ by controlling power supply 34. Exemplary power supplies 34 include, but are not limited to, Model SDL-820, for 10–15 amp CW laser diode driver with typical 10 $\mu$s current transition time; Model SDL-830 for about 50 amp CW laser driver; or Model SDL-928, for about 150 amp peak quasi-CW laser diode array drivers. All sold by SDL, Inc. of San Jose, Calif.

Then, positioning system 36 moves the beam output position to a new target area 31. The beam positioning system 36 preferably includes a translation stage positioner that employs at least two transverse stages permitting quick movement between target areas 31 on the same or different work pieces 30. In a preferred embodiment, the translation stage positioner is a split-axis system where a Y stage moves work piece 30, and an X stage moves a fast beam positioner and associated focusing lens(es). The Z dimension between the X stage and Y stage may also be adjustable. The positioning mirrors align the optical path 22 through any turns between laser resonator 12 and the fast beam positioner. The fast beam positioner may for example employ high resolution linear motors and/or a pair of galvanometer mirrors that can conduct unique or repetitive processing operations based on provided test or design data. The stages and positioner can be controlled and moved independently or coordinated to move together.

Beam positioning system 36 can employ conventional vision or beam to work alignment systems that work through an objective lens or off axis with a separate camera and that are well known to skilled practitioners. In one embodiment, an HRVX vision box employing Freedom Library software in a positioning system 36 sold by Electro Scientific Industries, Inc. is employed to perform alignment between the laser resonator 12 and the target areas 31 on the work piece 30. Other suitable alignment systems are commercially available.

In addition, beam positioning system 36 also preferably employs non-contact, small-displacement sensors to determine Abbe errors due to the pitch, yaw, or roll of the stages that are not indicated by an on-axis position indicator, such as a linear scale encoder or laser interferometer. The Abbe error correction system can be calibrated against a precise reference standard so the corrections depend only on sensing small changes in the sensor readings and not on absolute accuracy of the sensor readings. Such an Abbe error correction system is described in detail in International Publication No. WO 01/52004 A1 published on Jul. 19, 2001 and U.S. Publication No. 2001-0029674 A1 published on Oct. 18, 2001. The relevant portions of the disclosure of the corresponding U.S. patent application Ser. No. 09/755,950 of Cutler are herein incorporated by reference.

Many variations of positioning systems 36 are well known to skilled practitioners and some embodiments of positioning system 36 are described in detail in U.S. Pat. No. 5,751,585 of Cutler et al. The ESI Model 5320 microvia drilling system available from Electro Scientific Industries, Inc. of Portland, Oreg. is a preferred implementation of positioning system 36 and has been used for laser drilling of resin coated copper packages for the electronics industry. Other preferred positioning systems such as Model series numbers 27xx, 43xx, 44xx, or 53xx, manufactured by Electro Scientific Industries, Inc. in Portland, Oreg., can also be employed. Skilled persons will also appreciate that a system with a single X-Y stage for work piece positioning with a fixed beam position and/or stationary galvanometer for beam positioning may alternatively be employed. Those skilled in the art will recognize that such a system can be programmed to utilize toolpath files that will dynamically position at high speeds the focused UV laser system output pulses 40 to produce a wide variety of useful patterns, which may be either periodic or non-periodic.

The CPU 32 causes current to be applied or increased to the diodes 14 either when the positioning system 36 reaches, or is about to reach, a new or second target area 31 or at a predetermined time interval following and inhibition or reduction in diode pumping. The CPU 32 instructs the Q-switch control 38 to open the Q-switch 24 to deliver the laser pulses 60 at a predetermined repetition rate until the second via is made.

The profile of the pumping current intervals 50 can be modulated to control the shape of the peak power profile of the laser pulses 60 during the quasi-CW pumping, such as flat, from low to high (shown in FIG. 2A) or from high to low during the period. Furthermore, the current profiles can be modulated to have different amplitudes so for example a high peak power can be used for drilling metal layers and lower peak power can be used for drilling dielectric layers, if desired. Similarly, the time periods for current pumping intervals 50 can be adjusted to suit the size, depth, and material of the via to be processed, such as longer current intervals 50 for larger diameter vias. FIGS. 2A and 2B demonstrate that the laser system 10 permits, but does not require, variable periods of current pumping intervals 50 and variable periods between current pumping intervals 50, while the duty cycle can be kept the same. The duty cycle could, however, be varied as well, if desirable for laser output profiling.

The quasi-CW pumping repetition rate can easily be made as high as 2 kHz. The interval time between the quasi-CW pumping doesn't have to be constant as long as the average thermal loading to the laser pumping diode 14 and/or laser medium 16 remains relatively constant or below thermal damage levels.

In one embodiment, the diodes 14 and power supply 34 of a CW pumped 5 W UV laser system 10 are changed to be conducive to variable current pumping. The resulting laser system 10 is able to run at a duty cycle of 2 to 1 at 500 Hz. The diodes 14 pump the laser medium 16 for 1 ms before they stop for another 1 ms. Thus, during the pumping period, about twice as much current can be put into the diodes 14 (without adversely affecting the average thermal loading on the diodes 14 or the laser medium 16). Thus, the laser power during that 1 ms pumping period can be more than twice as much as that from a comparable CW pumped laser (especially after the nonlinear frequency conversion). The A-O Q-switch 24 used in the laser resonator 12 repetitively switches to deliver the laser pulses 60 at a pre-determined repetition rate of, for instance, 10 kHz or up to 50 kHz.

Work piece 30 that may, for example, be an IC chip package, MCM, capacitor, circuit board, resistor, or hybrid or semiconductor microcircuit. For convenience, work piece 30 is described below as only having four layers. Top and bottom conductive layers may contain, for example, standard metals such as, aluminum, copper, gold, molybdenum, nickel, palladium, platinum, silver, titanium, tungsten, metal nitrides, or combinations thereof. Conventional metal layers vary in thickness, typically between 9–36 $\mu$m, but may be thinner or thicker. The conductive layers are typically made of the same material.

A dielectric matrix or layer is sandwiched between the conductive layers and may, for example, contain a standard organic dielectric material such as benzocyclobutane (BCB), bismaleimide triazine (BT), cardboard, cyanate esters, epoxies, phenolics, polyimides, polytetrafluorethylene (PTFE), various polymer alloys, or combinations thereof. Conventional organic dielectric layers vary considerably in thickness, but are typically much thicker than the metal layers. An exemplary thickness range for organic dielectric layers is about 30–400 $\mu$m.

The dielectric layer may also contain a standard reinforcement component that may include a fiber matte or dispersed particles of, for example, aramid fibers, ceramics, or glass woven or dispersed throughout the organic dielectric. Conventional reinforcement components are typically individual filaments or particles of about 1–10 $\mu$m in size and/or woven bundles of 10 $\mu$m to several hundreds of microns. Skilled persons will appreciate that reinforcement components may be introduced as powders into the organic dielectrics and can be noncontiguous and nonuniform. Such composite or reinforced dielectric layers typically require laser processing at a higher fluence than is needed to ablate unreinforced dielectric layers. Skilled persons will also appreciate that these various layers may also be internally noncontiguous, nonuniform, and nonlevel. Stacks, having several layers of metal, dielectric, and reinforcement material, may be thicker than 2 mm.

Via diameters preferably range from 25–300 $\mu$m, but laser system 10 may produce vias that have diameters as small as about 5–25 $\mu$m or greater than 1 mm. Because the preferred ablated spot size of laser pulses 60 is about 25–75 $\mu$m in diameter, vias larger than 25 $\mu$m may be produced by trepanning, concentric circle processing, or spiral processing. Skilled persons will appreciate that vias may be noncircular, such as square, rectangular, oval, slot-like, or other surface geometries.

Through-hole vias cleanly and evenly penetrate all layers and materials of work piece 30 and preferably exhibit negligible taper from via top to via bottom. Blind vias do not penetrate all layers and/or materials, typically stopping at a lower or bottom conductive layer. Proper selection of the laser parameters permits the lower or bottom conductive layer to remain unaffected even if it comprises the same metal component(s) as the top metal layer.

The parameters of laser output 40 are selected to facilitate substantially clean, sequential drilling, i.e., via formation, in a wide variety of metallic, dielectric, and other material targets that may exhibit different optical absorption, ablation threshold, or other characteristics in response to UV or visible light. The parameters of laser system output 40 include an average energy per pulse greater than about 120 $\mu$J measured at the work surface, preferably greater than 200 $\mu$J; spot size diameters or spatial major axes of less than about 50 $\mu$m, and preferably from about 1–50 $\mu$m; a repetition rate of greater than about 1 kHz, preferably greater than about 5 kHz, and most preferably even higher than 20 kHz; and a wavelength preferably between about 190–532 nm, and most preferably between about 250 nm and 400 nm. Specific preferred wavelengths include, but are not limited to, 1064 nm, 532 nm, 355 nm, 349 nm, or 266 nm.

The preferred parameters of laser output 40 are selected in an attempt to circumvent certain thermal damage effects by utilizing temporal pulse widths that are shorter than about 150 ns, and preferably from about 40–90 ns or lower. Skilled persons will also appreciate that the spot area of laser pulses 60 is generally circular, but may be slightly elliptical. Preferred UV laser drilling parameters are disclosed in U.S. Pat. Nos. 5,593,606 and 5,841,099.

Blind vias, and particularly blind vias with large diameters, are preferably created by a two pass process in which the conductive layer for all target areas is removed in the first pass and then the dielectric layer for all the target areas is removed during the second pass with the fluence of the laser output being below the conductive layer ablation threshold. After the top conductive layer of all the target areas is removed, the fluence for the laser output during the second pass can be reduced by defocusing the laser spot and/or by increasing the repetition rate, as well as by decreasing the current to the laser pumping diode 14.

Skilled persons will appreciate that blind vias can also be created in a single pass process where both the conductive and dielectric layers of each target are is removed before the positioning system 36 moves to a subsequent target area 31. Single pass processing is preferred for creating smaller diameter vias. In a single pass process, it would be more efficient to maintain a fairly high fluence as the laser pulses 60 begin to remove the dielectric layer, but as the laser pulses 60 clear away the dielectric layer and expose the bottom conductive layer such that it begins to absorb heat from laser output 40, damage to the bottom conductive layer would be reduced by using a lower fluence. Thus, a gradual defocus of the laser spot or decrease in the pumping current during dielectric removal would be faster, more efficient, and protect bottom metal layer better than using a single fluence for dielectric removal. These and other laser output profiling techniques for via drilling processes are described in detail in U.S. patent application Ser. No. 09/823,922 and U.S. Patent Publication No. US2001-0045419, published on Nov. 29, 2001. The detailed description and drawings of U.S. patent application Ser. No. 09/823,922 are herein incorporated by reference.

It will be obvious to those having skill in the art that many changes may be made to the details of the above-described embodiment of this invention without departing from the underlying principles thereof. The scope of the present invention should, therefore, be determined only by the following claims.

What is claimed is:

1. A method for machining with a laser system through at least one layer of target material at multiple target areas on a work piece, the laser system employing a solid-state laser medium and a pumping source, the solid-state laser medium being limited in an amount of pumping power that the solid-state laser medium can tolerate over an extended period of time due to thermally-induced distortion, comprising:

addressing a beam positioner toward a first target area on the work piece;

supplying current at a first higher current level to the laser pumping source for pumping the solid-state laser medium during a first time interval;

operating an intra-cavity acousto-optic Q-switch to generate a first laser output having at least two laser pulses at a repetition rate of at least 2 kHz during the first time interval;

applying the first laser output to the first target area to remove target material from the first target area;

reducing to a lower current level, the current supplied to the laser pumping source to reduce thermal load within the solid-state laser medium during a second time interval;

addressing the beam positioner toward a second target area, different from the first target area, on the work piece during the second time interval;

increasing to a second higher current level, the current supplied to the laser pumping source for pumping the solid-state laser medium during a third time interval;

operating the Q-switch to generate a second laser output having at least two laser pulses at a repetition rate of at least 2 kHz during the third time interval; and applying the second laser output to the second target area to remove target material from the second target area.

2. The method of claim 1 in which the laser pumping source comprises a laser pumping diode and the first and second laser outputs have output power levels that vary as a function of the level of current supplied to the laser pumping diode and in which the laser pumping diode has a current-induced cumulative thermally-related pumping capacity that limits the amount of pumping power that can be delivered from the laser pumping diode to the laser medium over the first through third time intervals, such that the lower level of current supplied during the second time interval permits the higher level of current supplied during the first and third time intervals to exceed a maximum CW current level for the laser pumping diode over a CW time interval to the first through third time intervals and such that output power levels of the first and second laser outputs at a given pulse repetition rate exceed a maximum CW-pumped laser output power level for the laser medium at the given pulse repetition rate when pumped by the laser pumping diode at the maximum CW current level.

3. The method of claim 2 in which the output power levels of the first and second laser outputs exceed the maximum CW-pumped laser output power level, and the first and second laser outputs respectively remove first layer target material from the first and second target areas.

4. The method of claim 2 in which one of the first or second higher current levels can be lower than the maximum CW current level.

5. The method of claim 2 in which the laser system has a via drilling throughput that varies as a function of the power levels of the laser outputs and the via drilling throughput exceeds a maximum CW-pumped laser via drilling throughput for the laser system when operated at the maximum CW-pumped laser output.

6. The method of claim 1 in which the first and third time intervals represent equal amounts of time and in which equal amounts of current are supplied during the first and third time intervals.

7. The method of claim 1 in which the first and third time intervals represent different amounts of time.

8. The method of claim 1 in which a first amount of current is supplied during the first time interval and a third amount of current is supplied during the third time interval, and the first and third amounts of current are different.

9. The method of claim 1 in which the lower current level comprises substantially no current.

10. The method of claim 1 in which the first and/or second higher current levels are modulated to comprise at least first and second different current level values during the respective first and third time intervals.

11. The method of claim 10 in which the first current level value is higher than the second current level value, the first current level value is applied during processing of a metal layer within the target areas, and the second current level value is applied during processing of a dielectric layer within the target areas.

12. The method of claim 1 in which the first and second laser outputs have power levels that vary as a function of the level of current supplied to the laser pumping diode and in which the laser medium exhibits a thermally-induced cumulative distortion that limits the amount of pumping power that can be applied to the laser medium over the first through third time intervals, such that a lower level of pumping power supplied to the laser medium during the second time interval permits a higher level of pumping power supplied to the laser medium during the first and third time intervals to exceed a maximum CW pumping power for the laser medium over a CW time interval equivalent to the first through third time intervals and such that the power levels of the first and second laser outputs exceed a maximum CW-pumped laser output for the laser medium when pumped at the maximum CW pumping power.

13. The method of claim 12 in which the laser system has a via drilling throughput that varies as a function of the power levels of the laser outputs and the via drilling throughput exceeds a maximum CW-pumped laser via drilling throughput for the laser system when operated at the maximum CW-pumped laser output.

14. The method of claim 1 in which the Q-switch generates laser pulses at a repetition rate of greater than 2 kHz.

15. The method of claim 1 in which the first and second laser outputs comprise a wavelength that is shorter than about 400 nm.

16. The method of claim 1 in which the first and second laser outputs comprise a wavelength emitted by a YAG or YLF laser or one of the harmonics of such wavelengths including, but not limited to, 1064 nm, 532 nm, 355 nm, or 266 nm.

17. The method of claim 1 in which the beam positioner changes the output position from the second target area to a third discrete target area during a fourth time interval that represents a different amount of time from that of the second time interval.

18. The method of claim 1 in which vias in a single layer are formed in a single pass operation.

19. The method of claim 1 in which vias through more than one target layer are formed in a double pass operation.

20. The method of claim 1 in which vias through more than one target layer are formed in a single pass operation.

* * * * *

UNITED STATES PATENT AND TRADEMARK OFFICE
CERTIFICATE OF CORRECTION

PATENT NO. : 6,806,440 B2  
DATED : October 19, 2004  
INVENTOR(S) : Sun et al.

It is certified that error appears in the above-identified patent and that said Letters Patent is hereby corrected as shown below:

Column 3,
Line 47, add an open parenthesis before "generically".

Column 8,
Line 8, add -- equivalent -- after "time interval".

Signed and Sealed this

Seventeenth Day of May, 2005

JON W. DUDAS
*Director of the United States Patent and Trademark Office*